United States Patent [19]
Freyman et al.

[11] Patent Number: 5,991,220
[45] Date of Patent: Nov. 23, 1999

[54] SOFTWARE PROGRAMMABLE WRITE-ONCE FUSE MEMORY

[75] Inventors: Ronald Lamar Freyman, Bethlehem; Bruce Walter McNeill, Allentown; Malcolm Harold Smith, Macungie; Gary H. Weiss, Slatington, all of Pa.

[73] Assignee: Lucent Technologies, Inc., Murray Hill, N.J.

[21] Appl. No.: 09/037,099

[22] Filed: Mar. 9, 1998

[51] Int. Cl.$^6$ ........................................................ G11C 7/00
[52] U.S. Cl. ............................................. 365/225.7; 365/96
[58] Field of Search ................................... 365/96, 225.7, 365/200, 230.08

[56] References Cited

U.S. PATENT DOCUMENTS

| | | | |
|---|---|---|---|
| 3,976,983 | 8/1976 | Moussie | 365/96 |
| 4,876,645 | 10/1989 | Shioya et al. | 364/200 |
| 5,235,335 | 8/1993 | Hester et al. | |
| 5,299,152 | 3/1994 | Ishihara et al. | 365/96 |
| 5,353,028 | 10/1994 | de Wit et al. | |
| 5,566,107 | 10/1996 | Gilliam | 365/225.7 |
| 5,610,865 | 3/1997 | Shin et al. | 365/225.7 |
| 5,619,469 | 4/1997 | Joo | 365/225.7 |
| 5,636,172 | 6/1997 | Prall et al. | 365/225.7 |
| 5,703,824 | 12/1997 | Isa | 365/225.7 |
| 5,712,588 | 1/1998 | Cjoi et al. | 365/96 |
| 5,768,288 | 6/1998 | Jones | 371/22.2 |
| 5,838,620 | 11/1998 | Zager et al. | 365/225.7 |
| 5,862,007 | 12/1998 | Takahashi | 365/225.7 |
| 5,867,087 | 1/1999 | Lee | 365/225.7 |

OTHER PUBLICATIONS de Wit et al., "A Low–Power 12–b Analog–to–Digital Converter with On–Chip Precision Trimming,", IEEE Journal of Solid–State Circuits, vol. 38, No. 4, Apr. 1993.

Vance, "Post–package trim increases IC reliability," Electronic Engineering Times, (Sep. 1997).

Robinson, "PROM fuse design scales to sub–0.25 micron," Electronic Engineering Times, (Sep. 1997).

*Primary Examiner*—David Nelms
*Assistant Examiner*—Gene N. Auduong

[57] ABSTRACT

Blowable fuses on an integrated circuit are programmed in software, responsive to the control of an addressable memory which communicates with the peripheral data bus of a digital processor to allow increased flexibility of the programming operation, and to allow for correction both during the manufacturing process and after packaging of the manufactured integrated circuit. In a preferred embodiment, the fuses are operated (i.e., blown) responsive to transistor switching elements present on the integrated circuit and which are controlled by the addressable memory. The switching elements, and the associated fuses, can be accessed through software in similar fashion to any other peripheral device. The preferred addressable memory includes an instruction register and a data register, which are loaded from and write to the peripheral data bus. Internally, the data register includes an array of registers corresponding to the fuse links with which the system is associated. Data words in the registers are written from or read to the data register tinder the control of instructions in the instruction register, and the fuses are then blown serially, by reference to the data in the registers.

35 Claims, 6 Drawing Sheets

SOFTWARE PROGRAMMABLE WRITE-ONCE FUSE MEMORY

TECHNICAL FIELD

The present invention is generally directed to the field of programmable fuses for use with integrated circuitry, and in particular, to the programming of such fuses to assume desired states.

BACKGROUND OF THE INVENTION

Blowable fuses have been used in a variety of applications to control the operative features of an integrated circuit. For example, such fuses have been used for the correction of bandgap references and data converters. Usually, this is done at the wafer probe stage and requires the use of substantial off-chip equipment.

In practice, such techniques have been found to be subject to certain limitations. One such limitation is that it is often desirable to operate upon the fuses not only at the wafer probe stage, but also later, following packaging. Other limitations result from the amount of power which is required to operate (blow) such fuses. For example, the switching element provided on the integrated circuit for blowing the fuse must in practice occupy on the order of one-half of the total area of the blowable fuse circuit. Primarily, this is because the size of the switching element which is used to blow the fuse is responsive to the amount of current required to open the fuse, which continues to present a significant limitation. In addition, the amount of power required to blow the fuse has in practice been found to be potentially damaging to the passivation layer of the integrated circuit, which can permit the passage of moisture and the corrosion which can result from such moisture.

Efforts have been made to overcome these limitations. For example, De Wit et al., "A Low-Power 12-b Analog-to-Digital Converter with On-Chip Precision Trimming", IEEE Journal of Solid-State Circuits, Vol. 28, No. 4 (April, 1993), discloses the use of blowable fuses to reduce the capacitor ratio error in a data converter circuit. Circuits for accomplishing this are further described in U.S. Pat. Nos. 5,353,028 and 5,235,335. In an effort to allow programmable, on-chip adjustments to be performed after packaging, and at a lower voltage (power) level, De Wit et al. suggest the use of poly-silicon fuses.

In addition to the need to improve upon the blowable fuses, there is a corresponding need to improve upon the operations which are used to program such fuses, while ensuring that the fuses are both safely and reliably blown. For example, De Wit et al. suggest the programming of their disclosed poly-silicon fuses using a corresponding series of switching elements (e.g., transistor switching elements). The switching elements are coupled with the fuses in pairs, and are operated responsive to data loaded into a shift register.

The state of each fuse pair (i.e., "opened" or "closed") is serially established (one at a time) responsive to operation of the associated switching elements, and the state to be established for each fulse pair is determined by the data stored in the shift register (all "ones" except for any fuses to be opened). While this results in fuses that are logic programmable, such programming is limited in operation and a more flexible means of programming the fuses therefore remains desirable.

SUMMARY OF THE INVENTION

In accordance with the present invention, the foregoing problems are solved by providing a system which allows the fuses to be programmed in software, responsive to the control of an addressable memory. To this end, the fuses are coupled with the addressable memory so that the fuses can be programmed under software control. The addressable memory communicates with the peripheral data bus of the digital processor to allow increased flexibility of the programming operation, and to allow for correction both during the manufacturing process and after packaging of the manufactured integrated circuit. This further allows end-users to use the addressable memory to store data unique to their particular product.

In a preferred embodiment, a digital memory that can be written to once includes a plurality of fuse elements. The fuses are operated (i.e., blown) responsive to switching elements present on the integrated circuit (e.g., transistor switching circuits). The switching elements are controlled by an addressable memory, which in turn communicates with the peripheral data bus of the digital processor. As a result, the switching elements, and the fuses with which the switching elements are associated, can be accessed through software in similar fashion to any other peripheral device connected to the peripheral data bus.

Operation of the switching elements, via the peripheral data bus, is responsive to two registers including an instruction register and a data register. The instruction register and the data register are loaded from or write to the peripheral data bus. Internally, a link array is developed which includes a plurality of registers made up of bits formed from, and corresponding to the fuse links with which the system is associated. Data words in the registers are written from or read to the data register under the control of instructions in the instruction register. Words are written to the memory by first loading the words into the data register from the data bus, and then into the internal register designated by the instruction. The fuses are then blown serially, by reference to the data in the internal register. Data is read from the fuses into the internal register and, when required, from the internal register into the data register, and accordingly, onto the peripheral data bus.

BRIEF DESCRIPTION OF THE DRAWINGS

The invention is best understood from the following detailed description when read in connection with the accompanying drawings. It is emphasized that, according to common practice, the various features of the drawings are not drawn to scale. On the contrary, the dimensions of the various features are arbitrarily expanded or reduced for clarity. Included in the drawings are the following Figures.

DETAILED DESCRIPTION OF PREFERRED EMBODIMENTS

Figure 1:
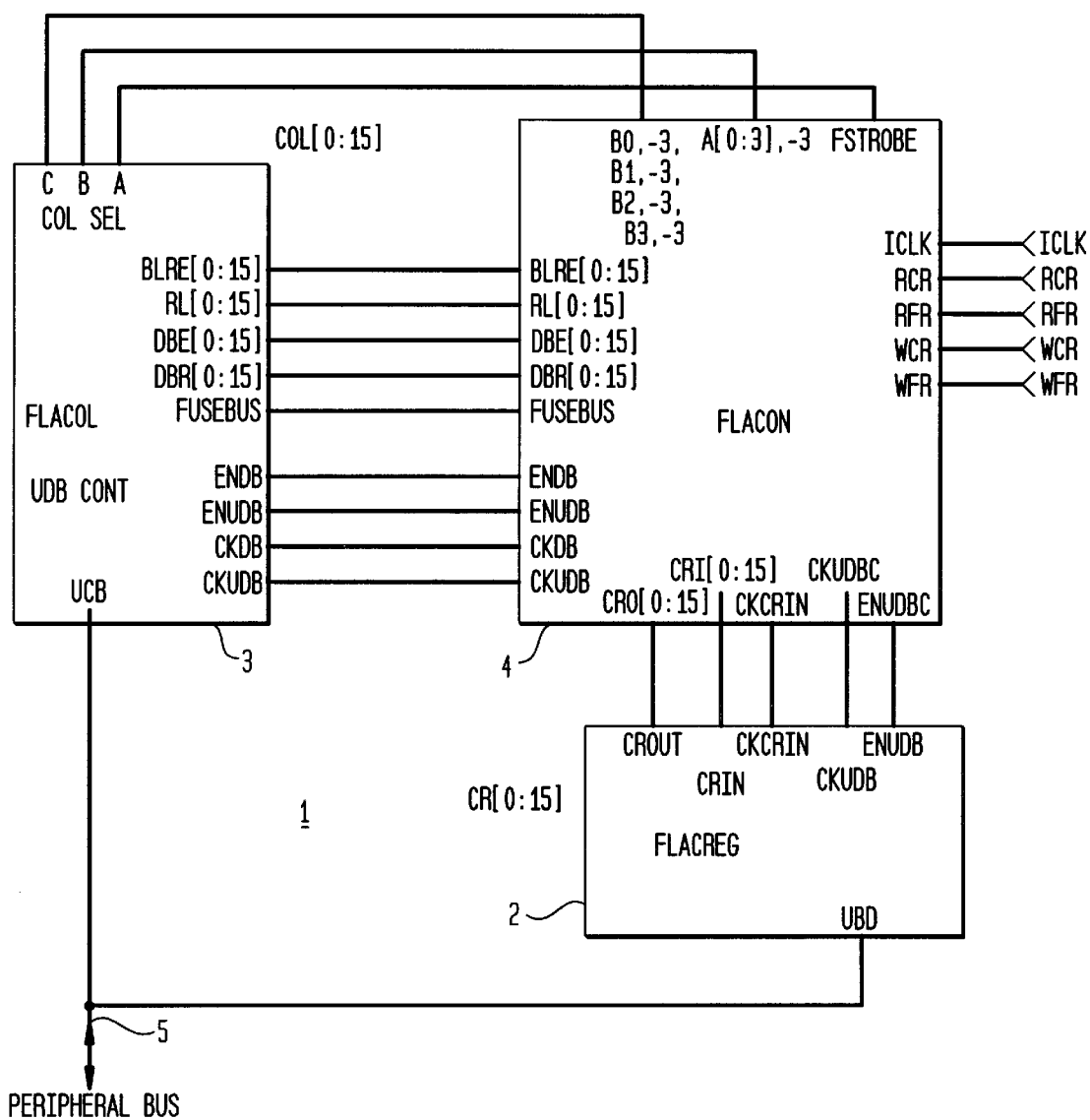
FIG. 1 is a schematic diagram showing circuitry for implementing a preferred embodiment system in accordance with the present invention.

FIG. 1 shows a circuit 1 for selectively controlling a plurality of fuses associated with an integrated circuit. The circuit 1 is itself associated with the integrated circuit, and is simplified to the extent possible to occupy the minimum amount of space on the integrated circuit (in addition to the fuses). The circuit 1 is shown implemented for use in controlling an array of 256 fuses associated with the integrated circuit. However, as will be discussed more fully below, the circuit 1 may be implemented with different numbers of fuses, in any of a variety of different arrays and configurations.

The circuit 1 generally includes an instruction register 2 and a data register 3, each of which is in communication with a suitable controller 4. The instruction register 2 and the controller 4 may be implemented using any of a variety of known circuit components, and therefore need not be described in further detail. In accordance with the present invention, both the instruction register 2 and the data register 3 communicate with the peripheral data bus 5 of a digital processor (not shown), allowing the circuit 1 to be operated in the same manner as any other peripheral device.

The data register 3 includes an array of internal registers for separately controlling each of the fuses associated with the integrated circuit. For the presently illustrated embodiment, comprised of 256 fuse links, this will result in a corresponding array of 256 link-controlling registers (arranged in 16 rows and 16 columns). Each of the registers in this array is uniquely identifiable, responsive to the instruction register 2, and separately addressable, responsive to operations of the controller 4. To this end, both the instruction register 2 and the controller 4 are similarly implemented in arrays (rows and columns), which correspond to the array of link-controlling registers conistituting the data register 3.

Figure 2:
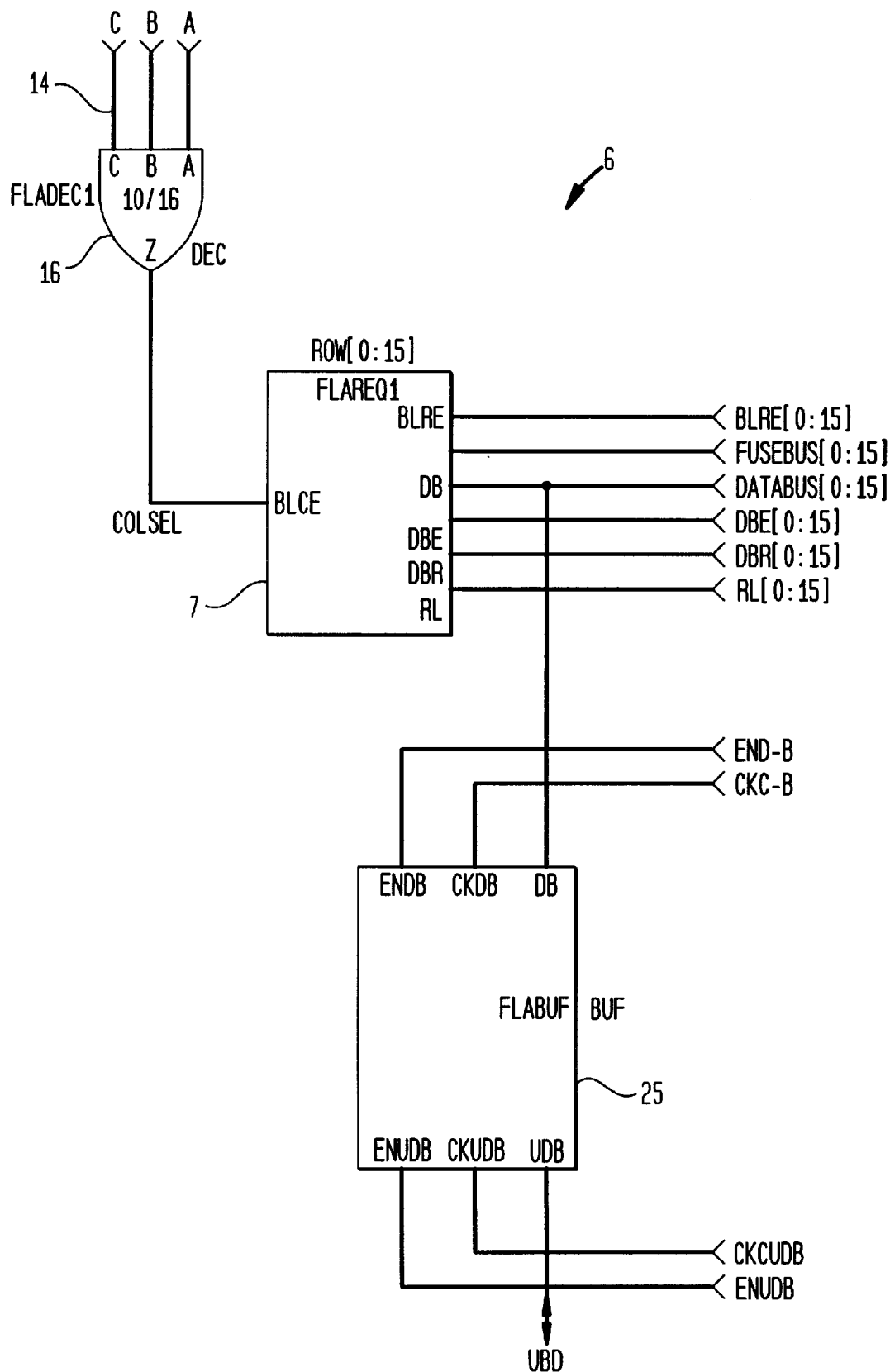
FIG. 2 is a schematic diagram showing portions of the data register of FIG. 1 in greater detail.
Figure 3:
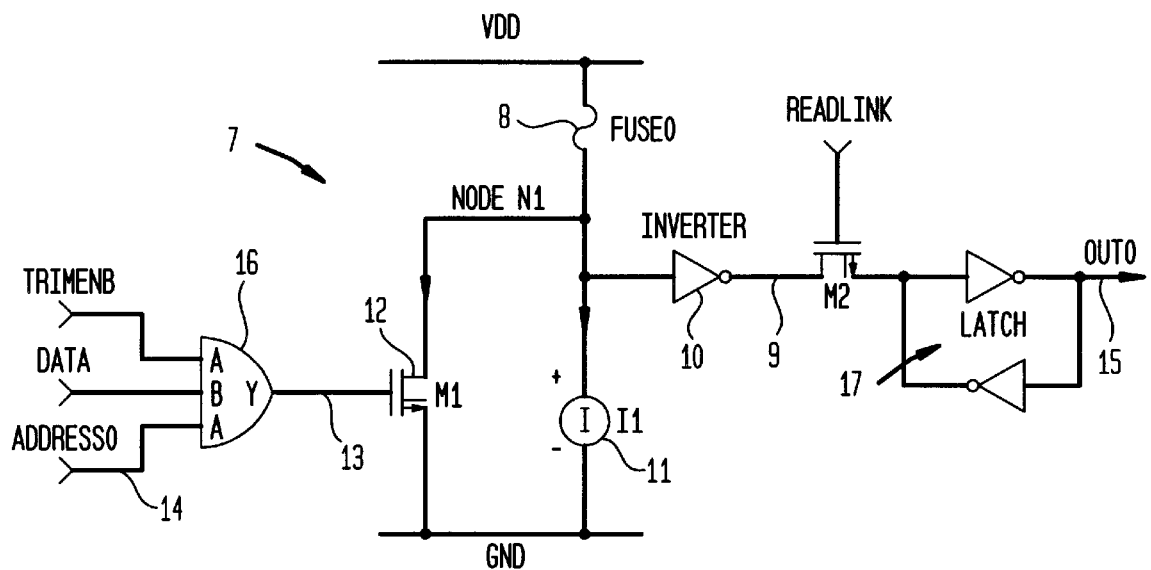
FIG. 3 is a schematic diagram showing the circuitry associated with each of a plurality of fuse links.

FIG. 2 generally illustrates one of the link-controlling registers 6 forming the array developed within the data register 3, and FIG. 3 shows a simplified schematic of a circuit 7 for implementing the register 6 to control the operation of a corresponding fuse 8 (i.e., "fuse link"). Each fuse 8 is preferably formed of a metal, and is advantageously implemented as a Metal 2 runner on the order of 0.56 microns in width and 30 microns in length. The fuses 2 are further preferably implemented without a SiN cap opening.

When in a closed state (i.e., not blown), the fuse 8 (the FUSE0 in FIG. 3) operates to pull the node N1 up to VDD, which drives the output 9 of an inverter stage 10 to a logic LOW. When the fuse 8 is open, the current source 11 operates to pull the node N1 to ground (GND) and drives the output of the inverter stage 10 to a logic HIGH.

The fuse 8 is blown responsive to operations of a switching element 12, which in the preferred embodiment is implemented as an Nch transistor (preferably an 800/0.48 Nch transistor). To this end, the gate 13 of the switching element 12 is caused to go HIGH, pulling a sufficient amount of current (e.g., at least 0.25 A) through the fuse 8 to melt the fuse 8 open. The Nch transistor should be kept ON for 100 μS to give the fuse 8 sufficient time to open. While such fuses typically open in about 20 μS, it has been found that this time will vary with layout and probe contact resistance, and operation for 100 μS has been found to allow a sufficient margin of safety. In practice (upon integration), approximately one-half of the layout area of the circuit 7 has been found to be occupied by the switching element 12 (with the remainder of this area being occupied by the latch and the logic gates).

Each of the fuses 8, and its corresponding operating circuit 7, is made separately addressable. To this end, the circuit 7 receives an input 14 (the input ADDRESS0) which is unique to the corresponding fuse 8 (the FUSE0), and develops an output 15 (the output OUT0) which is also unique to FUSE0. The remaining inputs shown (TRIMENB, DATA, and READLINK) are all common, and shared with the other fuses.

To drive the gate 13 of the switching element 12 (in this case, the Nch transistor) HIGH, all three inputs to the AND gate 16 must similarly be at a logic HIGH. The TRIMENB (trim enable) input is used as a fail-safe input, to keep the trim links from inadvertently being blown. For any given state of the counter which operates the circuit 7, which will be discussed more fully below, only one address line is HIGH at any given time, with the result being that the fuses 8 are operated one at a time. The DATA input is preferably set to a logic HIGH to blow the fuse 8, and kept at a logic LOW when the addressed fuse is to remain intact.

The state of the fuse 8 is latched into the output 15 by taking the READLINK input to a logic HIGH. The READLINK input needs to remain HIGH for 0.1 μS to ensure that the sense circuit (to be discussed more fully below) has adequate time to set the latch 17. When the READLINK input is returned to a logic LOW, the latch 17 retains the logic state, and the DC bias currents are shut off. The READLINK input also can be tied to VDD if the DC current drain is acceptable.

Each unblown link draws about 70 μA of current with VDD set to 3 V, and each grouping, of eight circuits preferably has a separate bias reference that draws another 320 μA. The current drain per link can be further reduced when the parametrics of the blown fuses are better known. Less than 5 μA per link should be required to reliably sense Metal 2 fuses.

Figure 4:
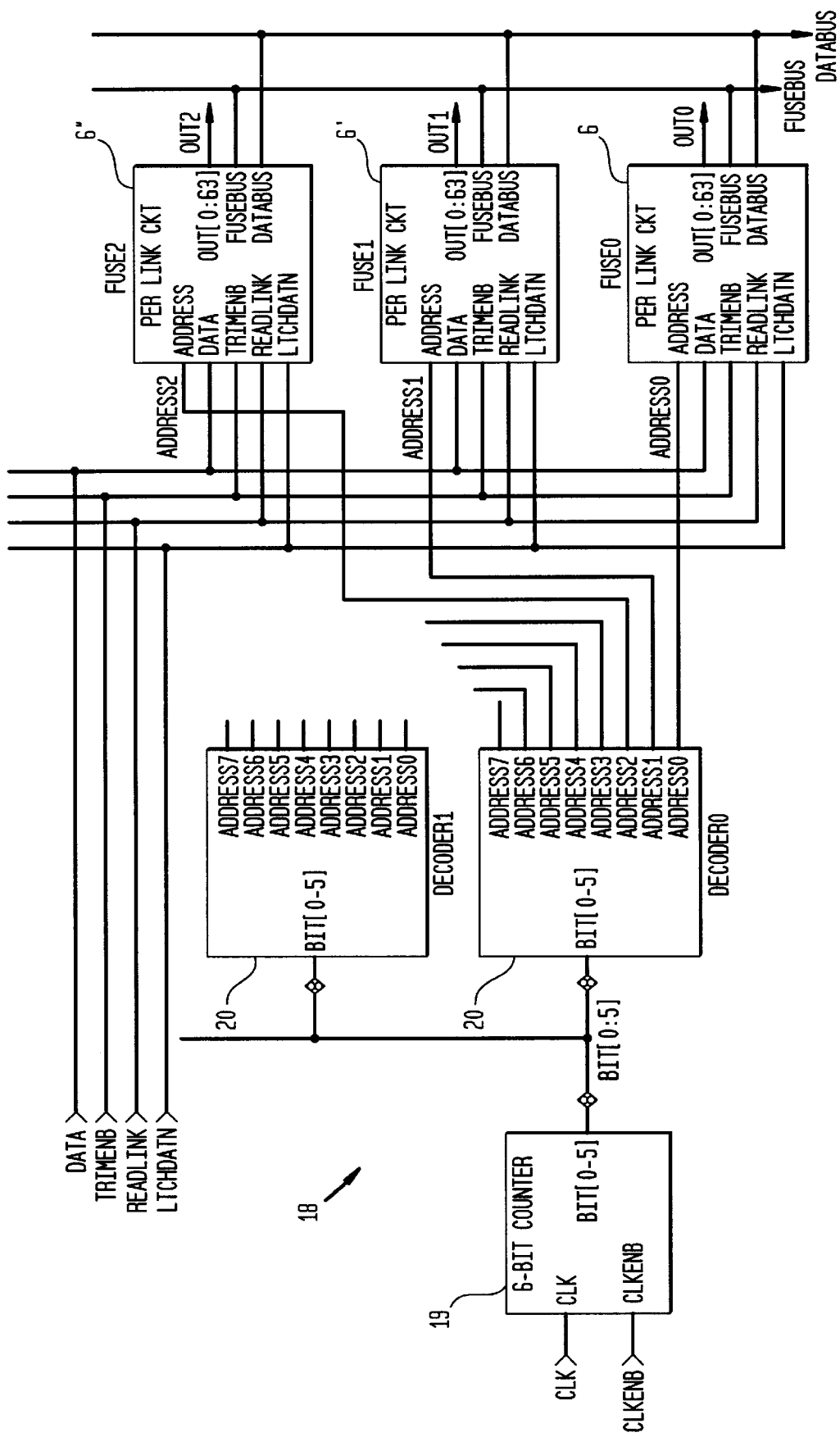
FIG. 4 is a block diagram showing circuitry for selectively operating the circuitry associated with each of the plurality of fuse links.

FIG. 4 shows a block diagram of a trim link circuit 18 for use with plural fuse circuits 6, 6', 6" of the type shown in FIG. 3, for separately operating each of several fuses FUSE0, FUSE1 and FUSE2. The circuit 18 has six logic inputs including a CLK (clock) input, a CLKENB (clock enable) input, a DATA input, a TRIMENB (trim enable) input, a READLINK input, and a LTCHIDATN (latch data not) input. When the CLKENB input is at a logic LOW, the counter 19 is reset to 000000, and FUSE0 is addressed in this state. When CLKENB goes HIGH, the counter 19 is enabled, and the counter 19 increments each time the CLK input exhibits a transition from HIGH to LOW. Suitable decoders 20 (DECODER1 and DECODER2) are coupled with the counter 19, for communicating, with the addressable circuits 6, 6', 6". To blow an addressed fuse, the DATA input is taken to a logic HIGH (e.g., for 100 μS). The DATA input is kept LOW if the fuse is to remain intact. The following instruction set is presently preferred for use in implementing the foregoing operations, with the understanding, that any of a number of equivalent instruction sets could similarly be used for such purposes.

General Notes: The control registers of the controller 4 and the fuse registers 6 of the data register 3 can be read to and written from the DATABUS (UDB), as follows:

RCR—Reads the value of the control register to UDB.

RFR—Reads the value of the fuse register to UDB.

WCR—Writes UDB with the value of the control register.
WFR—Writes UDB with the value of the fuse register.
Bit Assignments:

0–3: The lower 4 bits of the control register contain the address of the active fuse register.

4, 5: Reserved (for future expansion).

6: Status bit (shows the status of the fuse link array). A "1" indicates that the array is "busy", which generally means that fuse setting is in progress.

7, 8: Auto-increment bits. If the auto-increment bits are "1", a fuse register "read" or "write" causes the address to advance by 1.

9: When bit 9 is set, the value of the fuse is loaded into the fuse register pointed to by the address in the control register.

10: When bit 10 is set, the value of the fuse register pointed to by the address is used to program the associated fuse. This process is not reversible.

11–15: Reserved.

Control Register Bits:

| | |
|---|---|
| 0 ADDRESS LSB | 8 AUTO INCREMENT WRITE |
| 1 ADDRESS BIT 1 | 9 READ LINK TO REGISTER N |
| 2 ADDRESS BIT 2 | 10 WRITE LINK FROM REGISTER N |
| 3 ADDRESS BIT 3 | 11 RESERVED |
| 4 ADDRESS BIT 4 (Reserved) | 12 RESERVED |
| 5 ADDRESS BIT 5 (Reserved) | 13 RESERVED |
| 6 STATUS | 14 RESERVED |
| 7 AUTO INCREMENT READ | 15 RESERVED |

Figure 5:
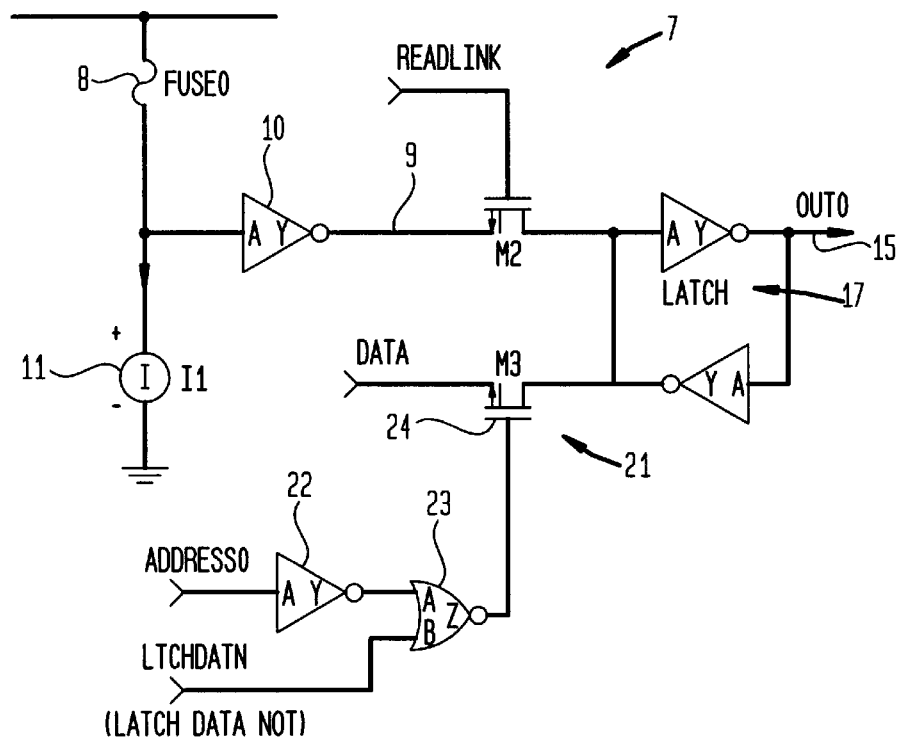
FIG. 5 is a schematic diagram showing preloading of the latch associated with the circuitry of FIG. 3.

The latches 17 can be preloaded with data so that the effects of trimming can be determined before the links are actually blown (which is not a reversible process). FIG. 5 shows a simplified schematic of a circuit 21 for performing such a preloading function. The circuit 21 is mated with portions of the circuit 7 of FIG. 3, and like reference numbers denote corresponding structures. The latch 17 is loaded directly from the DATA input, when the corresponding address line (ADDRESS0, inverted at 22) is HIGH, by momentarily taking the LTCHDATN input LOW. This forces the output of the NOR gate 23 to a logic HIGH, which turns on a pass transistor 24 (M3), causing the desired sampling (preloading) to take place.

Figure 6:
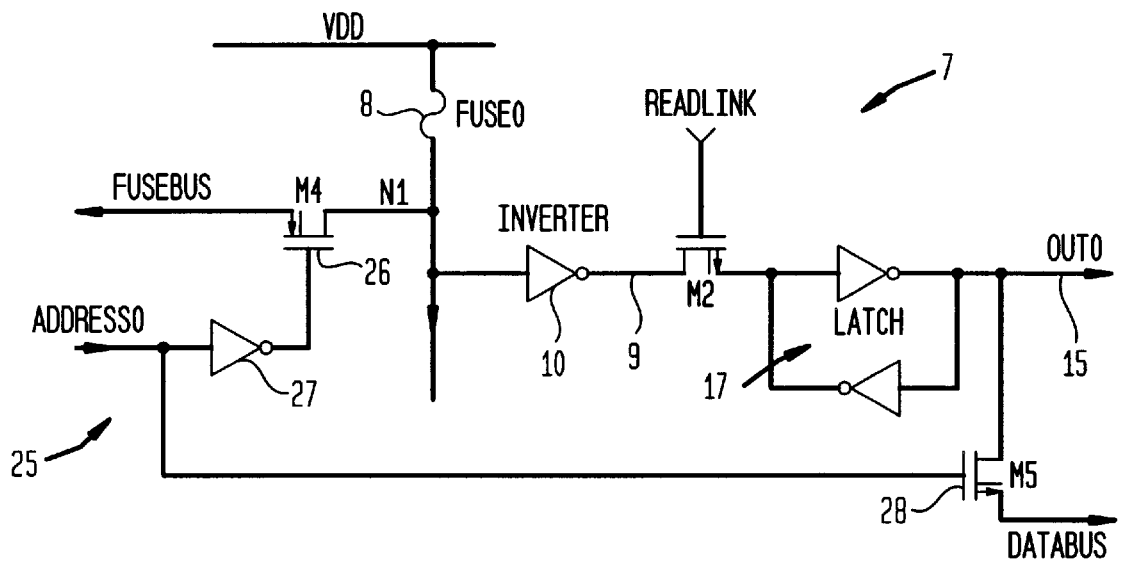
FIG. 6 is a schematic diagram showing how the circuitry of FIG. 3 interfaces with the Fusebus and the Databus of FIG. 4.

FIG. 6 shows a simplified schematic diagram of a circuit 25 for interfacing the fuse operating circuit 7 of FIG. 3 with the FUSEBUS and the DATABUS shown in FIG. 4. The circuit 25 is again shown mated with portions of the circuit 7 of FIG. 3, and like reference numbers again denote corresponding structures. The FUSEBUS is connected to each of the fuses 8 through a switching element 26 (M4), which is preferably implemented using a 3/1 Pch transistor. When the ADDRESS line (ADDRESS0) is HIGH, the switch 26 is turned on (following an inversion, at 27). This, in turns connects the fuse 8 to the FUSEBUS. By talking the FUSEBUS to ground (GND), the leakage current through an open fuse can be measured to determine whether the fuse has been cleanly (i.e., fully) opened. As an example, for a fuse 8 that remains intact, and assuming an operating voltage (VDD) of 3 V, taking the FUSEBUS to ground will draw about 250 $\mu$A. With the resistance of the link increased to 20 K$\Omega$, and with VDD at 3 V, taking the FUSEBUS to ground will draw only about 50 $\mu$A.

When the ADDRESS line (ADDRESS0) is HIGH, a further switching element 28 (M5) is turned on, connecting the output of the latch 17 (the output 15 of the circuit 7) to the DATABUS. This, in turn, permits the logic state of each of the latches 17 to be serially checked. When the output (OUT0) of the latch 17 is LOW, the DATABUS will be near ground. When the output (OUT0) of the latch 17 is HIGH, the DATABUS will be about 1 V below VDD.

Figure 7:
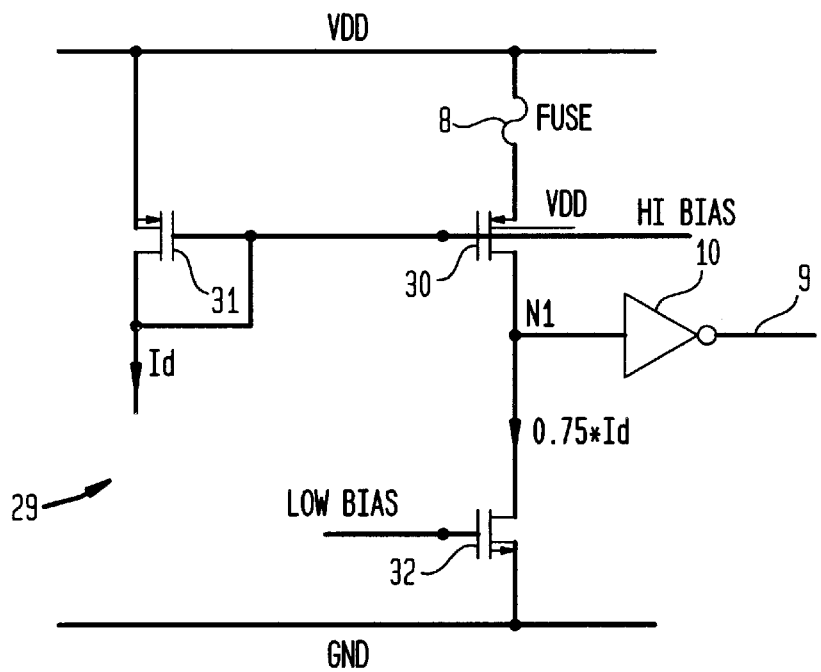
FIG. 7 is a schematic diagram of a sense amplifier for determining whether a fuse is in an open or a closed state.

FIG. 7 shows a simplified schematic of an amplifier 29 for sensing whether a given fuse 8 is open or closed. When the fuse 8 is intact, the switching element 30 will be biased (responsive to the switching element 31) at a current Id, while the switching element 32 will be biased at only ¾ of the value of Id. As a result, the node N1 will be pulled HIGH, with the switching element 32 in the "triode" region. When the fuse 8 is open, the current through the switching element 30 will drop to zero, and the switching element 32 will pull the node N1 LOW. Each of the switching elements 30, 31 is preferably implemented using a Pch transistor, and the switching element 32 is preferably implemented using an Nch transisitor.

Figure 8:
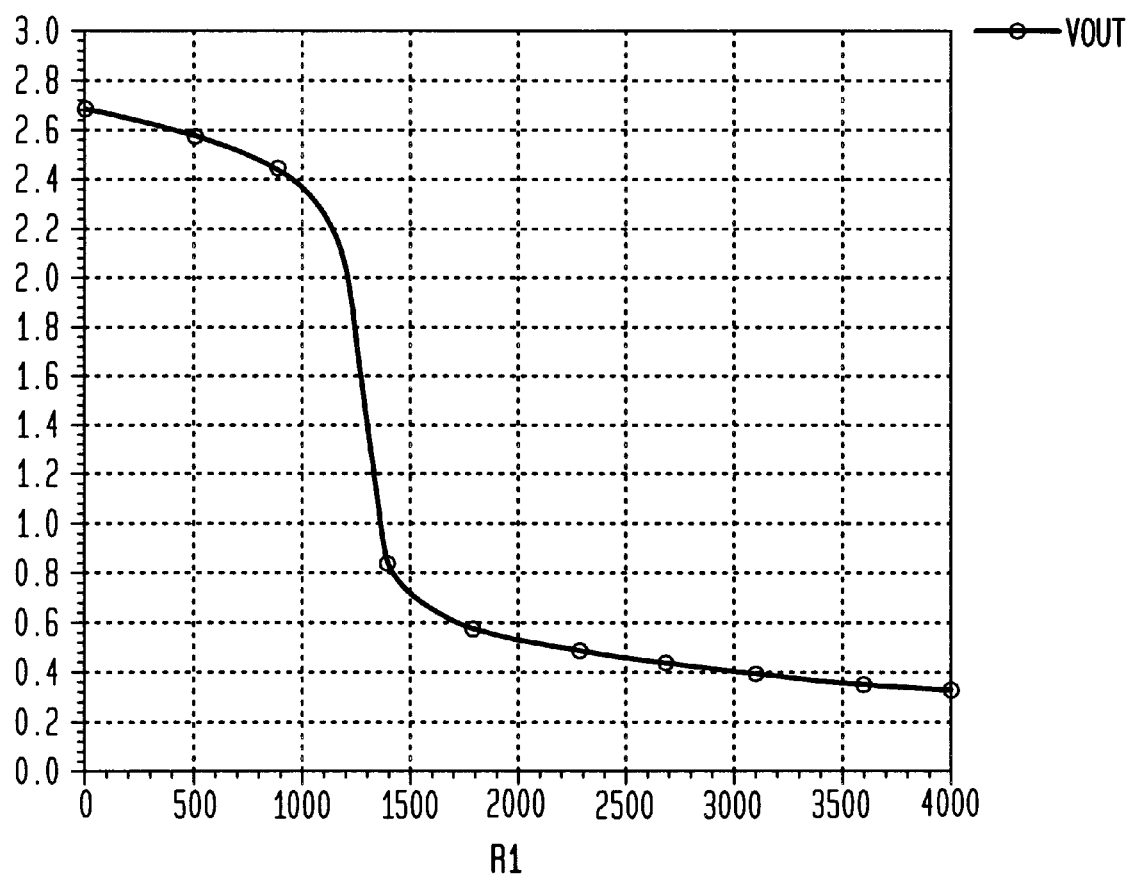
FIG. 8 is a graph showing output as a function of resistance, for establishing the sensitivity of the amplifier of FIG. 7.

In practice it has been found that fuse links do not always open cleanly, and that in some cases a resistive path can remain. When trimming fuse links, for example, at 5 V, residual paths have been observed with a resistance as low as about 20 K$\Omega$ for some fuses. Metal 2 fuses have been found to perform better in this regard. It is preferable for the sense amplifier 29 to be able to sense an open link, even for very leaky trimmed fuses. To this end, the sensitivity of the amplifier (in resistance) is measured at the source of the switching element 30, at which the node N1 goes from a logic HIGH to a logic LOW. The more sensitive the amplifier 29, the lower is the value of this resistance. FIG. 8 shows the voltage at the node N1 as a function of resistance in the source of the switching element 30. As shown, the node N1 will go from a logic HIGH to a logic LOW when the resistance in the source of the switching element 30 is about 1,300 $\Omega$. The resistance at which such switching will occur can be calculated, if desired, using known techniques.

Since the sensitivity of the amplifier 29 will improve with the square root of the bias current, and with the square root of $\beta$ (gain), this sensitivity can be adjusted by selecting the performance characteristics for the several switching elements, primarily the switching element 30. As an example, and for a switching element 30 implemented using a Pch transistor, an increase in the W/L ratio for the channel of the Pch transistor from 10/1 to 40/1 would result in an amplifier 29 which is twice as sensitive and which would switch at one-half the fuse resistance (or about 650 $\Omega$). On the other hand, if the bias current is reduced by a factor of four (e.g., from 70 $\mu$A to 17.5 $\mu$A), the amplifier 29 would be half as sensitive and would switch at about 2600 $\Omega$. While the nominal sensitivity of the amplifier 29 shown in FIG. 7 is about 1300 $\Omega$, local variations in the (FET) threshold voltage can cause this sensitivity to vary (in the worst case, to about 2000 $\Omega$).

For the Metal 2 fuse links that are preferred for use in accordance with the present invention, it takes about 0.25 A to reliably blow each fuse link, and resistance is the limiting factor. For this reason, it is preferable to momentarily increase the supply voltage when a fuse is to be blown. For example, a 3 V system can be increased to about 5 V for the short period needed to trim a particular link, while a 5 V supply can temporarily be increased to about 7 V. For the 5 V supply, the total resistance must be less than 20 $\Omega$, including the resistance of the Nch FET used as the switching element, the resistance of the power supply runners, the resistance of the fuse (about 1.4 $\Omega$) and the probe contact resistance (which can be as high as 4.5 $\Omega$ each). Increasing the supply voltage helps reduce the resistance of the switching element, and allow for a higher total resistance. For example, if the supply voltage is increased to 7 V, then the total resistance can be as high as 28 Ω for 0.25 A of trim current. The probe contact resistance can be reduced by using multiple probes or by blowing links after packaging.

The implementation of metal fuses and poly-silicon fuses in the manufacture of 0.35 µm CMOS integrated circuits requires about the same sized FET switching element to open a given fuse. In both cases, the net resistance of the FET switch, the probe contact resistance and the power supply (metal resistance) needs to be about 20 Ω or less. The poly-silicon fuses are characteristically about 27 ohms/square, and the optimal length of the fuse will give a net resistance of about 70 Ω to 100 Ω. Since a majority of the power supply voltage will need to fall across the fuse, the net resistance of the switch and the other sources needs to be less than about 20 Ω. For the metal fuses, about 0.25 A are needed to open the fuse. Using a 5 V power supply, the net resistance of the switch and the other sources must be less than about 20 Ω. Once metal fuses melt open, the fuse resistance is consistently large, usually greater than 15 KΩ. In addition, once open, the metal fuses do not reform. The poly-silicon fuses are much less predictable, and frequently leave paths of relatively low resistance. Under the influence of an electric field, the poly-silicon fuses will often reform. For these reasons, the use of metal fuses is presently preferred over the use of poly-silicon fuses for such applications.

Thus, in accordance with the present invention, a more compact electronic trim link circuit results when using switching elements which are preferably implemented as large Nch FET's to blow fusible metal links. Whether or not a given fuse is blown can be sensed by a comparator, with the output assuming a logic HIGH if the link is blown and a logic LOW if the link is not blown. In practice, such electronic trim links can occupy about 1/10th the area of probe pad trim links, and with electronic links, a circuit can be trimmed after packaging.

Such a circuit can be implemented with any desired number of links. For example, the circuit of the present invention has been implemented with a series of 64 links organized in modular 8-link blocks. It is expected that a circuit implemented with 128 links will occupy about 1 mm² of surface area. A circuit implemented with only 24 trim links could be layed out with only three blocks. The circuit can also be implemented as part of a DSP architecture, if desired.

During the trimming operation, the fuses are preferably programmed sequentially (e.g., with a 6-bit counter 19, and decoders 20 that address one fuse at a time, as previously described). The condition (states) of the fuses can be read in parallel, and the states of the fuses can be latched (the latch 17) so that DC current drain can be stopped.

In any event, the electronic trim link circuit of the present invention can be made significantly smaller than was previously possible. By minimizing the probe contact resistance, and the power supply resistance, the size of the switching elements required for assured operation can be still further reduced. The illustrative circuit previously discussed uses 75 µA of biasing current per fuse link, calling for an amplifier having a sensitivity of 2,000 Ω. However, it is expected that this can be reduced through careful selection of the materials, and the configuration of the fuse links (e.g., for open fuses reliably exhibiting greater than 10 KΩ, the bias current could be reduced to about 3 µA per fuse).

Circuit designs requiring only a few trim links can be made very compact. As an example, for a circuit with 16 trim links, the counter 19 could be reduced from a 6-bit counter to a 4-bit counter, the logic for the corresponding decoder 20 could be simplified, and the latches 17 could be eliminated. With post-packaging trimming, the size of the Nch FET switching elements used to blow the links could be reduced, especially for technology capable of sustaining 7 V for the short period of time needed for trimming.

The present invention has a wide range of applications. Such memory could be used to store encryption codes for data encryption, for products such as cellular phones, pagers and computer data communications. Such memory could also be used for the correction of on-chip memory, which would lead to an increased yield, and which would also allow for a parametric correction of analog components after packaging. Such techniques could also be used to program data into a chip, responsive to a user's control. In practice, the uses for the improvements of the present inventions will be limited only by the requirements of a particular user for write-once data storage.

It will therefore be understood that various changes in the details, materials and arrangement of parts which have been herein described and illustrated in order to explain the nature of this invention may be made by those skilled in the art within the principle and scope of the invention as expressed in the following claims.

What is claimed:

1. An apparatus for selectively controlling a plurality of fuses associated with an integrated circuit, wherein each of the fuses is switchable from a closed state to an opened state, and wherein the apparatus comprises:
   a data register including an array of internal registers, wherein each of the internal registers is operatively coupled with one of the fuses, wherein each of the internal registers is identified by an address, and wherein each of the internal registers is separately addressable in accordance with the address assigned to the internal register;
   an instruction register, wherein the instruction register contains instructions for determining whether the fuses are to assume the opened state or the closed state; and
   a controller connecting the data register and the instruction register, wherein the controller combines with the data register to cause the fuses associated with the internal registers to assume the states determined by the instruction register.

2. The apparatus of claim 1 wherein the data register and the instruction register communicate with a peripheral data bus of a digital processor.

3. The apparatus of claim 1 wherein the fuses are metal fuses.

4. The apparatus of claim 1 wherein the internal registers are combined in an array corresponding to an array of the fuses.

5. The apparatus of claim 4 wherein each of the internal registers in the array is defined by a unique address.

6. The apparatus of claim 1 wherein each of the internal registers includes a series combination of the fuse and a semiconductor switch connected between a voltage source and ground.

7. The apparatus of claim 6 wherein the switch is an Nch transistor.

8. The apparatus of claim 6 which further includes a latch, wherein the latch operates to retain the state for each of the fuses.

9. The apparatus of claim 8 wherein the latches are preloadable latches.

10. The apparatus of claim 8 which further includes a sense amplifier coupled with the latch, wherein the sense amplifier combines with the latch to determine the state of each fuse.

11. The apparatus of claim 6 wherein the controller combines with the data register to operate the internal registers serially and one at a time.

12. The apparatus of claim 11 wherein the controller includes a counter coupled with a decoder, wherein the counter is incremented to serially address the internal registers, and wherein the decoder couples the counter with each of the internal registers to be addressed.

13. The apparatus of claim 6 wherein the internal register further includes means for determining the state of the fuse associated with the internal register.

14. The apparatus of claim 13 wherein the determining means includes means for measuring leakage current through the fuse.

15. An apparatus for selectively controlling a plurality of fuses associated with an integrated circuit and comprising an addressable memory coupled with the fuses, wherein each of the fuses is switchable from a closed state to an opened state, wherein the addressable memory includes means for causing the fuses to assume either the opened state or the closed state, and wherein the addressable memory communicates with a peripheral data bus of a digital processor, for controlling the state of the fuses responsive to instructions provided using the peripheral data bus.

16. The apparatus of claim 15 wherein the addressable memory includes a data register including an array of internal registers, wherein each of the internal registers is operatively coupled with one of the fuses;

an instruction register, wherein the instruction register contains instructions for determining whether the fuses are to assume the opened state or the closed state; and a controller connecting the data register and the instruction register, wherein the controller combines with the data register to cause the fuses associated with the internal registers to assume the states determined by the instruction register.

17. The apparatus of claim 16 wherein each of the internal registers is identified by an address, and wherein each of the internal registers is separately addressable in accordance with the address assigned to the internal register.

18. The apparatus of claim 16 wherein the fuses are metal fuses.

19. The apparatus of claim 16 wherein each of the internal registers includes a series combination of the fuse and a semiconductor switch connected between a voltage source and ground.

20. The apparatus of claim 19 wherein the switch is an Nch transistor.

21. The apparatus of claim 19 which further includes means for latching the state for each of the fuses.

22. The apparatus of claim 19 wherein the internal register further includes means for determining the state of the fuse associated with the internal register.

23. A method for selectively controlling a plurality of fuses associated with an integrated circuit responsive to instructions received from a peripheral data bus of an associated digital processor, wherein each of the fuses is switchable from a closed state to an opened state, and wherein the method comprises the steps of:

coupling each of the fuses with an addressable memory;

coupling the addressable memory with the peripheral data bus;

communicating with the addressable memory using the peripheral data bus, wherein the communicating includes providing the instructions for controlling the fuses; and controlling states of the fuses in accordance with the instructions provided using the peripheral data bus, responsive to operations of the addressable memory.

24. The method of claim 23 wherein the addressable memory includes a data register having a plurality of internal registers, wherein each of the internal registers is operatively coupled with one of the fuses, and an instruction register, wherein the instruction register contains the instructions for determining whether the fuses are to assume the opened state or the closed state, and wherein the method further includes the step of controlling operations of the data register and the instruction register so that the data register causes the fuses associated with the internal registers to assume the states determined by the instruction register.

25. The method of claim 24 wherein each of the internal registers is identified by an address, and which further includes the step of separately addressing each of the internal registers in accordance with the address which identifies the internal register.

26. The method of claim 25 which further includes the step of combining the internal registers in an addressable array.

27. The method of claim 24 wherein each of the internal registers includes a series combination of the fuse and a semiconductor switch connected between a voltage source and ground, and wherein the method further includes the step of selectively operating the semiconductor switch in accordance with the instructions for determining whether the fuses are to assume the opened state or the closed state.

28. The method of claim 27 which further includes the steps of operating the semiconductor switch to connect the fuse between the voltage source and ground, and opening the fuse.

29. The method of claim 28 wherein the voltage source has a defined level, and wherein the method further includes the step of momentarily increasing the level of the voltage source when the semiconductor switch is operated to connect the fuse between the voltage source and ground.

30. The method of claim 27 which further includes the step of latching the fuse to a retained state.

31. The method of claim 30 which further includes the step of preloading the latch to the retained state.

32. The method of claim 27 which further includes the step of determining the state of the fuse associated with the internal register.

33. The method of claim 32 wherein the determining includes measuring leakage current through the fuse.

34. The method of claim 24 wherein the controlling includes the step of operating the internal registers serially and one at a time.

35. The method of claim 34 wherein the internal registers are operated responsive to a counter coupled with a decoder, and wherein the method further includes the steps of incrementing the counter to serially address the internal registers, and coupling the counter with each of the internal registers to be addressed using the decoder.

* * * * *